(12) United States Patent  
Hu et al.

(10) Patent No.: US 7,567,595 B2
(45) Date of Patent: Jul. 28, 2009

(54) LASER SOURCE WITH INTERDIGITAL HEATER ELECTRODES AND UNDERLYING CURRENT CONFINEMENT LAYER

(75) Inventors: Martin Hai Hu, Painted Post, NY (US); Chung-En Zah, Holmdel, NJ (US)

(73) Assignee: Corning Incorporated, Corning, NY (US)

( * ) Notice: Subject to any disclaimer, the term of this patent is extended or adjusted under 35 U.S.C. 154(b) by 16 days.

(21) Appl. No.: 11/906,213

(22) Filed: Oct. 1, 2007

(65) Prior Publication Data
US 2009/0086775 A1 Apr. 2, 2009

(51) Int. Cl.
*H01S 3/13* (2006.01)
(52) U.S. Cl. .............. 372/29.013; 372/29.01; 372/22; 372/21; 372/34; 372/50.11
(58) Field of Classification Search .......... 372/50.11, 372/50.1, 29.013, 29.01, 22, 20, 21, 34
See application file for complete search history.

(56) References Cited

U.S. PATENT DOCUMENTS 5,748,660 A * 5/1998 Delorme et al. .......... 372/50.11
5,920,588 A * 7/1999 Watanabe .................. 372/96
6,031,860 A * 2/2000 Nitta et al. ................ 372/50.11
2006/0222033 A1 * 10/2006 Hayakawa et al. ....... 372/50.11

FOREIGN PATENT DOCUMENTS

JP 2004-077912 11/2004

OTHER PUBLICATIONS

"A DBR Laser Tunable by Resistive Heating", S. L. Woodward, IEEE Photonics Technology Letters, vol. 4, No. 12, Dec. 1992, pp. 1330-1332.

* cited by examiner

*Primary Examiner*—Minsun Harvey
*Assistant Examiner*—Kinam Park
(74) *Attorney, Agent, or Firm*—Kwadjo Adusei-Poki

(57) ABSTRACT

A semiconductor laser source is provided wherein the wavelength selective section of the laser diode comprises a P+ type current confinement layer and first and second sets of interdigital heater electrodes formed over the current confinement layer. Individual electrode digits of the first and second sets of interdigital heater electrodes alternate in succession along a direction of optical propagation defined by the active waveguide layer of the laser diode. The first set of interdigital heater electrodes are positively or negatively biased relative to the laser diode cathode and relative to the second set of interdigital heater electrodes such that the relative bias is either less than the forward bias turn-on voltage of the P-N junction or has an absolute value less than the reverse breakdown voltage of the P-N junction.

24 Claims, 2 Drawing Sheets

US 7,567,595 B2

LASER SOURCE WITH INTERDIGITAL HEATER ELECTRODES AND UNDERLYING CURRENT CONFINEMENT LAYER

BACKGROUND OF THE INVENTION

The present invention relates to wavelength selective laser diodes and laser sources incorporating the same.

BRIEF SUMMARY OF THE INVENTION

In accordance with one embodiment of the present invention, a semiconductor laser source is provided wherein the wavelength selective section of the laser diode comprises a P+ type current confinement layer and first and second sets of interdigital heater electrodes formed over the current confinement layer. Individual electrode digits of the first and second sets of interdigital heater electrodes alternate in succession along a direction of optical propagation defined by the active waveguide layer of the laser diode. The first set of interdigital heater electrodes are positively biased relative to the laser diode cathode and relative to the second set of interdigital heater electrodes. The relative bias $+V_{BIAS}$ of the first set of interdigital heater electrodes relative to the laser diode cathode is less than the forward bias turn-on voltage of the P-N junction.

In accordance with another embodiment of the present invention, the P+ type current confinement layer is formed over the P type semiconductor layer in the wavelength selective section and the phase matching section of the laser diode. Additional sets of interdigital heater electrodes can be formed over the current confinement layer in the phase matching section.

In accordance with another embodiment of the present invention, the first set of interdigital heater electrodes is negatively biased relative to the laser diode cathode and relative to the second set of interdigital heater electrodes and the relative bias $-V_{BIAS}$ of the first set of interdigital heater electrodes relative to the laser diode cathode has an absolute value less than the reverse break-down voltage of the P-N junction.

In accordance with yet another embodiment of the present invention, the laser source comprises a wavelength conversion device coupled to an optical output of the laser diode. An optical feedback loop can be configured to control the relative bias $+V_{BIAS}$ based on a converted output of the wavelength conversion device.

BRIEF DESCRIPTION OF THE SEVERAL VIEWS OF THE DRAWINGS

The following detailed description of specific embodiments of the present invention can be best understood when read in conjunction with the following drawings, where like structure is indicated with like reference numerals and in which.

DETAILED DESCRIPTION

Figure 1:
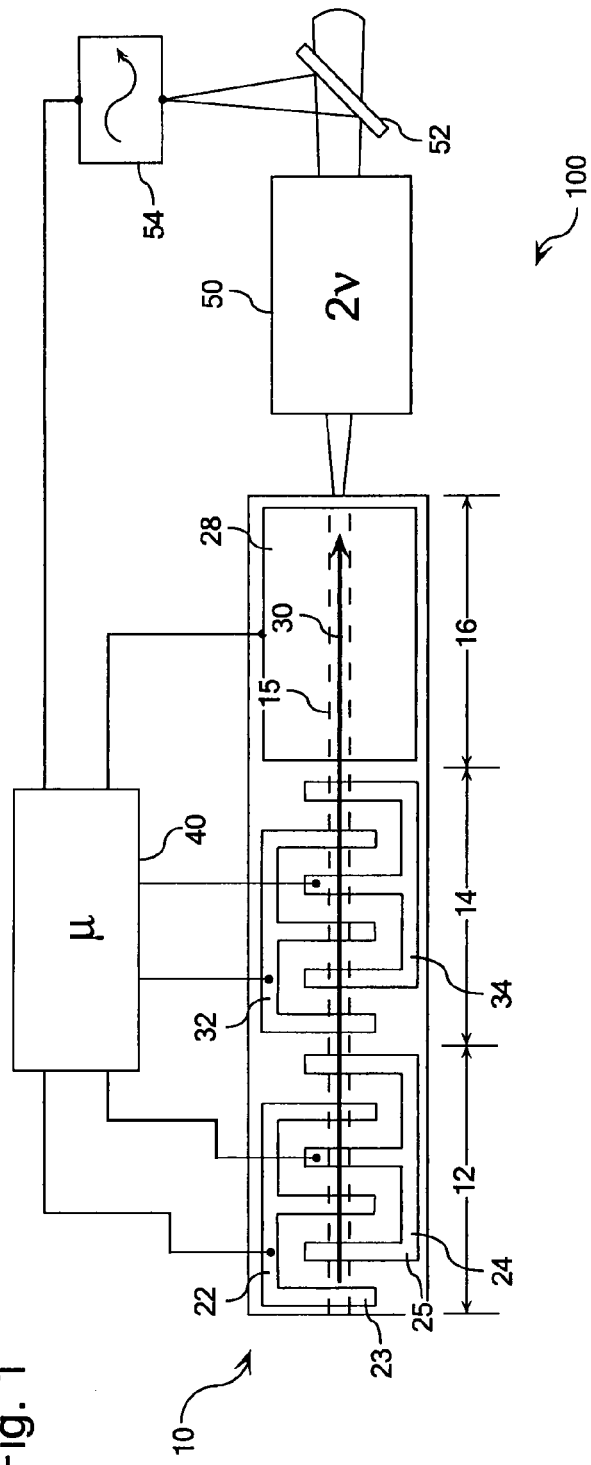
FIG. 1 is a schematic illustration of a laser source illustrating aspects of the present invention.

Referring initially to FIG. 1, the various aspects of the present invention can be illustrated in the context of a DBR laser diode 10, which is illustrated schematically in FIG. 1. Generally, the DBR laser diode comprises a wavelength selective section 12, a phase matching section 14, and a gain section 16. The wavelength selective section 12, which can also be referred to as the DBR section of the laser diode 10, typically comprises a first order or second order Bragg grating positioned outside the active region of the laser cavity. This section provides wavelength selection, as the grating acts as a mirror whose reflection coefficient depends on the wavelength. The gain section 16 of the DBR laser diode 10 provides the major optical gain of the laser and the phase matching section 14 creates an adjustable phase shift between the gain material of the gain section 16 and the reflective material of the wavelength selective section 12. The wavelength selective section 12 may be provided in a number of suitable alternative configurations that may or may not employ a Bragg grating.

The laser diode 10 is configured as a semiconductor heterostructure comprising an active waveguide layer 15 formed between P and N type semiconductor layers 13, 17 defining a P-N junction at the active waveguide layer 15. The P and N type semiconductor layers 13, 17 function as cladding layers and provide injection of holes and electrons into the active waveguide layer 15, respectively. Because the active waveguide layer 15 and its surrounding waveguiding material have refractive indices that are larger than those of the cladding layers 13, 17, light generated therein is confined in the active waveguide layer 15 and its surrounding waveguiding material. The wavelength selective section 12, the phase matching section 14, and the gain section 16 are each defined within the semiconductor heterostructure.

Figure 2:
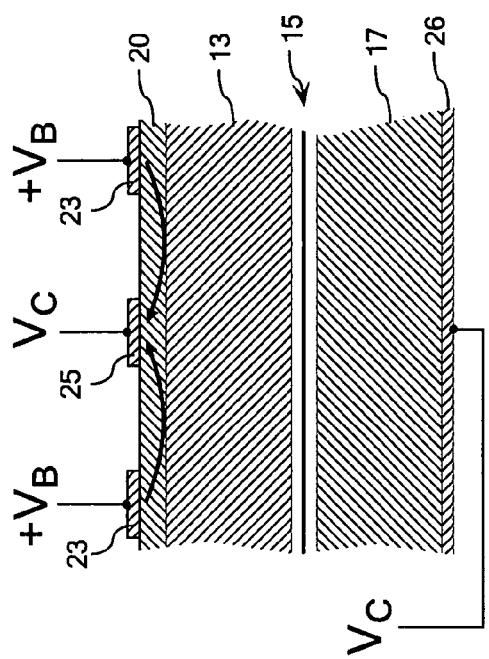
FIG. 2 is a schematic illustration of a portion of a semiconductor heterostructure illustrating aspects of the present invention.

Referring additionally to FIG. 2, the wavelength selective section 12 comprises a P+ type current confinement layer 20 formed over the P type semiconductor layer 13. First and second sets of interdigital heater electrodes 22, 24 are formed over the current confinement layer 20 in the wavelength selective section 12 of the laser diode 10. For the purposes of describing and defining the present invention, it is noted that "interdigital" electrodes are defined where one or more electrode digits of one set of electrodes are interposed between electrode digits of the other set of electrodes, and vice-versa. One relatively simple example of an interdigital electrode configuration is illustrated in FIG. 1, where individual electrode digits 23, 25 of the first and second sets of interdigital heater electrodes 22, 24 alternate in succession along a direction of optical propagation 30 defined by the active waveguide layer 15. The first and second sets of interdigital heater electrodes 22, 24 can be formed from any suitable conductor, although TiPt will often be a preferred composition.

Figure 3:
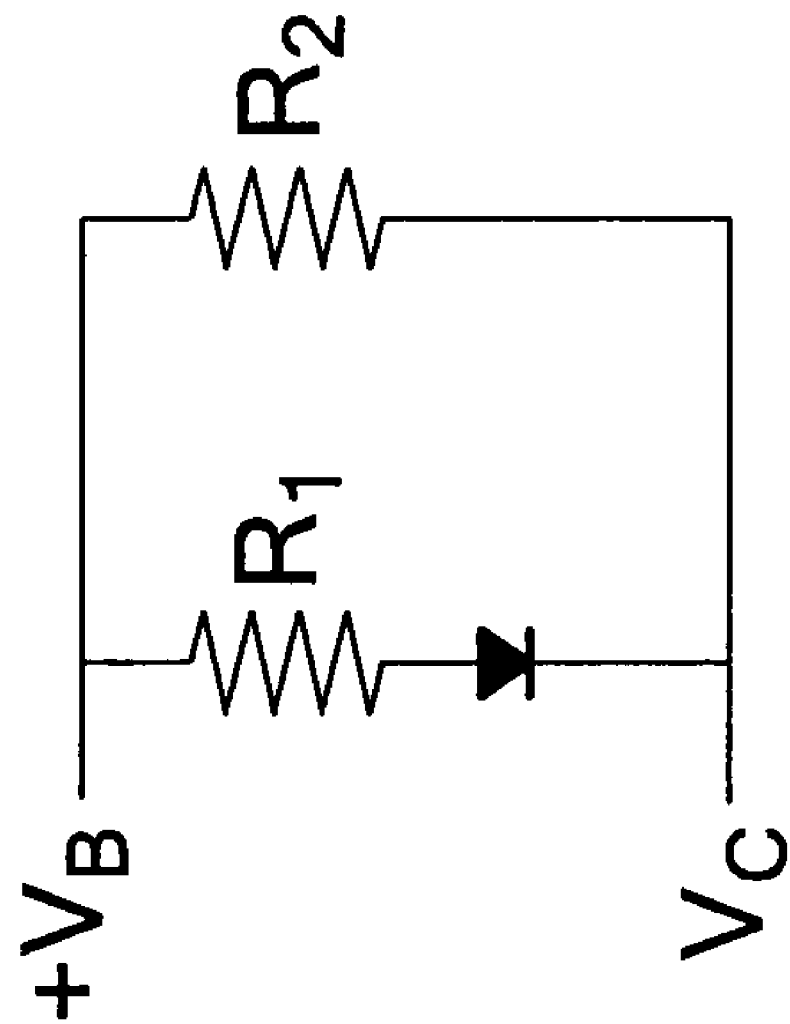
FIG. 3 illustrates an electrical equivalent circuit of a portion of a laser source according to one embodiment of the present invention.

The P+-type current confinement layer 20 is an electrically resistive contact layer that generates heat when it transports electrical current between adjacent electrode digits 23, 25. Generally, the amount of heat generated is proportional to the electrical current but the properties of the laser diode heterostructure place limits on the heater power. Specifically, referring to FIG. 3, which illustrates the electrical equivalent circuit of the wavelength selective section 12 including portions of both the current confinement layer 20 and the P-N junction of the wavelength selective section 12 of the laser diode 10, the electrical resistance of the P-N junction is illustrated as $R_1$ and the electrical resistance of the heater defined by the current confinement layer 20 is illustrated as $R_2$. If the P-N junction is reverse biased by one of the two interdigital electrodes and the reverse bias is maintained below the breakdown voltage of the P-N junction to ensure reliability of the P-N junction, the maximum heating power is as follows:

$$P_{MAX} = V_{BREAK\text{-}DOWN}^2 / R_2$$

where $V_{BREAK\text{-}DOWN}$ is the breakdown voltage of the P-N junction. This relationship makes it clear that a smaller heater resistance is desired for more heater power.

However, the present inventors have recognized that reverse biasing the P-N junction can remove photo current generated in the wavelength selective section 12 and make it more optically absorptive and generating a drop in optical power. In addition to the loss of optical power, the reverse bias can generate a relatively large photo current that can damage the P-N junction if the optical intensity is large enough.

In FIG. 2, the first set of interdigital heater electrodes 22 is positively biased relative to the laser diode cathode 26 and relative to the second set of interdigital heater electrodes 24. A controller 40, illustrated schematically in FIG. 1, can be configured to set the anode voltage $V_A$, the cathode voltage $V_C$, and the voltages of the first and second sets of interdigital heater electrodes 22, 24 in this manner. The relative bias $+V_{BIAS}$ of the first set of interdigital heater electrodes 22 relative to the laser diode cathode 26 is less than the forward bias turn-on voltage of the P-N junction. By biasing the laser diode 10 in the manner illustrated in FIG. 2, the wavelength selective section 12 can be operated to be free of the detrimental photo current effect. Typically, to ensure consistent operation, the relative bias $+V_{BIAS}$ of the first set of interdigital heater electrodes relative to the cathode voltage $V_C$ is less than about 90% of the forward bias turn-on voltage of the P-N junction. The resulting maximum heating power of the configuration illustrated in FIG. 2 can be represented as follows:

$$P_{MAX} = V_{TURN\text{-}ON}^2 / R_2$$

where $V_{TURN\text{-}ON}$ is the turn-on voltage of the P-N junction.

Although embodiments and features of the present invention are described herein with primary reference to embodiments where the relative bias of the first set of interdigital heater electrodes 22 relative to the laser diode cathode 26 is positive ($+V_{BIAS}$) and is less than the forward bias turn-on voltage of the P-N junction, it is contemplated that the relative bias of the first set of interdigital heater electrodes 22 relative to the laser diode cathode 26 can alternatively be negative ($-V_{BIAS}$). In which case the relative negative bias $-V_{BIAS}$ of the first set of interdigital heater electrodes 22 relative to the laser diode cathode 26 will have an absolute value less than the reverse break-down voltage of the P-N junction.

Noting that a smaller heater resistance is desired for more heater power, the interdigital configuration of the first and second sets of interdigital heater electrodes 22, 24 allows for convenient tailoring of the heater resistance R by choosing a gap distance between two opposing electrodes so that a desired heating power is achieved with an appropriate voltage without causing damage to the laser or loss of optical power. The heater current path along the waveguide is localized above the active waveguide layer 15. Since the heat generated by the P+-type current confinement layer 20 is close to the active waveguide layer 15, the heater configuration illustrated in FIG. 2 is highly efficient and fast in changing the temperature of the active waveguide layer 15. Accordingly, the heater configuration illustrated in FIG. 2 also yields an efficient and fast change of the effective index and lasing wavelength of the laser diode 10 and, as such, presents a preferred way for improving electrical wall-plug efficiency and speed of wavelength control in laser diodes and laser sources employing laser diodes and wavelength conversion elements, such as SHG crystals.

In the embodiment of the present invention illustrated in FIG. 2, the laser diode cathode 26 and the second set of interdigital heater electrodes 24 are held at a common cathode voltage $V_C$. Although this is a convenient configuration, the various concepts of the present invention should not be limited to control schemes where the laser diode cathode 26 and the second set of interdigital heater electrodes 24 are held at a common cathode voltage $V_C$. It is contemplated that there will be a variety of suitable values for the relative bias $+V_{BIAS}$ of the first set of interdigital heater electrodes 22 relative to the laser diode cathode 26, provided the relative bias $+V_{BIAS}$ is less than the forward bias turn-on voltage of the P-N junction. In the event the laser diode cathode 26 and the second set of interdigital heater electrodes 24 are held at different voltages, it should be clarified that it may be preferable to set the value of $+V_{BIAS}$ relative to the voltage of the laser diode cathode 26 and the voltage of the second set of interdigital heater electrodes 24 so that it is less than the forward bias turn-on voltage of the P-N junction in each case.

It is also contemplated that the resistivity of the current confinement layer 20 and the spacing of the individual electrode digits 23, 25 of the first and second sets of interdigital heater electrodes 22, 24 can take a variety of suitable values. The resistance of the current confinement layer 20 can be conveniently tailored by choosing the proper spacing of the individual electrode digits 23, 25 of the first and second sets of interdigital heater electrodes 22, 24. For example, and not by way of limitation, in one embodiment of the present invention, the resistivity of the current confinement layer 20 and the spacing of the individual electrode digits 23, 25 are such that a relative bias $+V_{BIAS}$ of between approximately 0 to approximately 2.2 Volts creates a shift in lasing wavelength of the laser diode of at least approximately 3 nm. More specifically, according to one embodiment of the present invention, it was found that a relative bias $+V_{BIAS}$ of 2.2 volts was sufficient to create a shift in lasing wavelength of the laser diode of 3.7 nm.

Although aspects of the present invention have been described in the context of the wavelength selective section 12 of the laser diode 10, it is contemplated that the P+ type current confinement layer 20 can also be formed over the P type semiconductor layer 13 in the phase matching section 14. In which case, additional sets of interdigital heater electrodes 32, 34 can be formed over the current confinement layer 20 in the phase matching section 14. In addition, referring to FIG. 1, where a drive electrode 28, also referred to as the laser diode anode, is formed over the P type semiconductor layer 13 in the gain section 16, it may be formed without the interposition of a P+ type current confinement layer between the drive electrode 28 and the P type semiconductor layer 13.

As is noted above, the controller 40 is configured to set the anode voltage $V_A$, the cathode voltage $V_C$, and the voltages of the first and second sets of interdigital heater electrodes 22, 24 such that the first set of interdigital heater electrodes 22 is positively biased relative to the laser diode cathode 26 and relative to the second set of interdigital heater electrodes 24. As is illustrated schematically in FIG. 1, the relative bias $+V_{BIAS}$ of the first set of interdigital heater electrodes 22 relative to the cathode voltage $V_C$ and the voltage of the second set of interdigital heater electrodes 24 is such that the majority of electric current generated between the first and second sets of interdigital heater electrodes 22, 24 is confined within the P+ type current confinement layer 20 and minimum current flows through the P-N junction to the laser diode cathode 26. In many cases, all of the electric current generated between the first and second sets of interdigital heater electrodes will be confined within the P+ type current confinement layer 20 and no current will flow through the P-N junction to the laser diode cathode 26.

Subject to the design constraints set forth herein, the particular compositions of the P and N type semiconductor layers 13, 17, the cathode layer 26, and the anode electrode 28 of the laser diode 10 heterostructure described herein may be selected in accordance with existing and yet to be developed teachings related to the design and operation of DBR laser diodes. The composition of the P+ type current confinement layer 20 should be selected to be compatible with the material of the P type semiconductor layer 13 and the material of the first and second sets of interdigital heater electrodes 22, 24. For example, where the P type semiconductor layer 13 comprises a P type AlGaAs cladding layer, the P+ type current confinement layer 20 may comprise heavily doped GaAs Other suitable candidates for the P+ type current confinement layer 20 include, but are not limited to heavily doped GaInAs, GaInAsP, InP, and combinations thereof. The thickness of the P+ type current confinement layer 20 may also be tailored to complement the particular DBR laser diode configuration in use. Having noted this, it is contemplated that confinement layer thicknesses of between about 50 nm and about 300 nm will be suitable in most circumstances.

Referring specifically to FIG. 1, laser sources according to the present invention may also be employed in the context of frequency-doubled or wavelength converted laser light sources. In the illustrated embodiment, the laser source 100 further comprises a wavelength conversion device 50 coupled to an optical output of the laser diode 10. The wavelength conversion device typically comprises a second harmonic generation (SHG) crystal, such as MgO-doped periodically poled lithium niobate (PPLN), that is configured to generate higher harmonic waves of the fundamental laser signal from the DBR laser diode 10. An optical feedback loop can be configured to tune the wavelength of the laser diode 10 to the spectral bandwidth of the SHG crystal by controlling the relative bias $+V_{BIAS}$ based on the converted output of the wavelength conversion device 50. To this end, the optical feedback loop comprises a beam splitter 52, a photodetector 54, and the controller 40. Alternatively, the controller 40 can be programmed to execute an open-loop control scheme to control the relative bias $+V_{BIAS}$ by, for example, randomly changing the voltage applied to the first or second sets of interdigital heater electrodes 22, 24 to introduce random dithering or perturbation of the control signal applied to the wavelength selective section 12, the phase matching section 14, or both.

The photodetector 54 and beam splitter 52 are configured to generate an electrical signal representing the intensity of the wavelength converted output of the laser diode 10. The controller 40 is programmed to stabilize intensity fluctuations in the converted output of the wavelength conversion device 50 by controlling the relative bias $+V_{BIAS}$ based on the intensity signal generated by the photodetector 54 and beam splitter 52. As is noted above, additional sets of interdigital heater electrodes 32, 34 can be formed over the current confinement layer 20 in the phase matching section 14 of the laser diode 10 and the optical feedback loop can be further configured to control the relative bias $+V_{BIAS}$ applied to the additional sets of interdigital heater electrodes 32, 34. It is also contemplated that the optical feedback loop may be further configured to control a drive voltage of the anode electrode 28.

It is noted that recitations herein of a component of the present invention being "configured" to embody a particular property, function in a particular manner, etc., are structural recitations, as opposed to recitations of intended use. More specifically, the references herein to the manner in which a component is "configured" denotes an existing physical condition of the component and, as such, is to be taken as a definite recitation of the structural characteristics of the component. In addition, it is noted that reference herein to a layer or material being formed "over" another layer or material should not be taken to exclude the possibility of an intervening layer or material being disposed between the two layers.

It is noted that terms like "preferably," "commonly," and "typically" are not utilized herein to limit the scope of the claimed invention or to imply that certain features are critical, essential, or even important to the structure or function of the claimed invention. Rather, these terms are merely intended to highlight alternative or additional features that may or may not be utilized in a particular embodiment of the present invention.

Having described the invention in detail and by reference to specific embodiments thereof, it will be apparent that modifications and variations are possible without departing from the scope of the invention defined in the appended claims. More specifically, although some aspects of the present invention are identified herein as preferred or particularly advantageous, it is contemplated that the present invention is not necessarily limited to these preferred aspects of the invention.

What is claimed is:

1. A laser source comprising a laser diode and a controller, wherein:
the laser diode is configured as a semiconductor heterostructure comprising an anode, a cathode, and an active waveguide layer formed between P and N type semiconductor layers defining a P-N junction;
the laser diode comprises a wavelength selective section, a phase matching section, and a gain section, each defined within the semiconductor heterostructure;
the wavelength selective section comprises a P+ type current confinement layer formed over the P type semiconductor layer and first and second sets of interdigital heater electrodes formed over the current confinement layer;
individual electrode digits of the first and second sets of interdigital heater electrodes alternate in succession along a direction of optical propagation defined by the active waveguide layer; and
the controller is connected to the cathode and the first and second sets of interdigital heater electrodes such that the first set of interdigital heater electrodes is positively biased relative to the laser diode cathode and relative to the second set of interdigital heater electrodes such that the P+-type current confinement layer transports electrical current between adjacent electrode digits of the first and second sets of interdigital heater electrodes along the direction of optical propagation defined by the active waveguide layer.

2. A laser source as claimed in claim 1 wherein the resistance of the current confinement layer and the spacing of the individual electrode digits of the first and second sets of interdigital heater electrodes are such that a relative bias $+V_{BIAS}$ of between approximately 0 to approximately 2.2 Volts creates a shift in lasing wavelength of the laser diode of at least approximately 3 nm.

3. A laser source as claimed in claim 1 wherein the P+ type current confinement layer is formed over the P type semiconductor layer in the wavelength selective section and the phase matching section.

4. A laser source as claimed in claim 1 wherein additional sets of interdigital heater electrodes are formed over the current confinement layer in the phase matching section.

5. A laser source as claimed in claim 1 wherein the controller is configured to set the anode voltage $V_A$, the cathode voltage $V_C$, and the voltages of the first and second sets of interdigital heater electrodes such that the first set of interdigital heater electrodes are positively biased relative to the laser diode cathode and relative to the second set of interdigital heater electrodes.

6. A laser source as claimed in claim 1 wherein the relative bias +$V_{BIAS}$ of the first set of interdigital heater electrodes relative to the cathode voltage $V_C$ and the voltage of the second set of interdigital heater electrodes is such that the majority of electric current generated between the first and second sets of interdigital heater electrodes is confined within the P+ type current confinement layer.

7. A laser source as claimed in claim 6 wherein minimum current flows through the P-N junction to the laser diode cathode.

8. A laser source as claimed in claim 1 wherein the relative bias +$V_{BIAS}$ of the first set of interdigital heater electrodes relative to the cathode voltage $V_C$ and the voltage of the second set of interdigital heater electrodes is such that the electric current generated between the first and second sets of interdigital heater electrodes is confined within the P+ type current confinement layer.

9. A laser source as claimed in claim 8 wherein no current flows through the P-N junction to the laser diode cathode.

10. A laser source as claimed in claim 9 wherein the controller is configured to set the voltage applied to the second set of interdigital heater electrodes at approximately the same value as the cathode voltage $V_C$.

11. A laser source as claimed in claim 1 wherein the relative bias +$V_{BIAS}$ of the first set of interdigital heater electrodes relative to the laser diode cathode and the voltage of the second set of interdigital heater electrodes is less than the forward bias turn-on voltage of the P-N junction.

12. A laser source as claimed in claim 1 wherein the relative bias +$V_{BIAS}$ of the first set of interdigital heater electrodes relative to the cathode voltage $V_C$ is less than about 90% of the forward bias turn-on voltage of the P-N junction.

13. A laser source as claimed in claim 1 wherein the relative bias +$V_{BIAS}$ of the first set of interdigital heater electrodes relative to the cathode voltage $V_C$ and the voltage of the second set of interdigital heater electrodes is less than about 90% of the forward bias turn-on voltage of the P-N junction.

14. A laser source as claimed in claim 1 wherein the laser source further comprises a wavelength conversion device coupled to an optical output of the laser diode and an optical feedback loop configured to control the relative bias +$V_{BIAS}$ based on a converted output of the wavelength conversion device.

15. A laser source as claimed in claim 14 wherein the optical feedback loop comprises a beam splitter, a photodetector, and the controller.

16. A laser source as claimed in claim 15 wherein:
the photodetector and beam splitter are configured to generate an electrical signal representing the intensity of the wavelength converted output; and
the controller is programmed to stabilize intensity fluctuations in the converted output of the wavelength conversion device by controlling the relative bias +$V_{BIAS}$ based on the intensity signal generated by the photodetector and beam splitter.

17. A laser source as claimed in claim 14 wherein the optical feedback loop is further configured to control a relative bias +$V_{BIAS}$ of a additional sets of interdigital heater electrodes formed over the current confinement layer in the phase matching section of the laser diode.

18. A laser source as claimed in claim 1 wherein the laser source further comprises a wavelength conversion device coupled to an optical output of the laser diode and a controller programmed to execute an open-loop control scheme to control the relative bias +$V_{BIAS}$.

19. A laser source comprising a laser diode and a controller, wherein:
the laser diode is configured as a semiconductor heterostructure comprising an anode, a cathode, and an active waveguide layer formed between P and N type semiconductor layers defining a P-N junction;
the laser diode comprises a wavelength selective section, a phase matching section, and a gain section, each defined within the semiconductor heterostructure;
the wavelength selective section comprises a P+ type current confinement layer formed over the P type semiconductor layer and first and second sets of interdigital heater electrodes formed over the current confinement layer;
individual electrode digits of the first and second sets of interdigital heater electrodes alternate in succession along a direction of optical propagation defined by the active waveguide layer; and
the controller is connected to the cathode and the first and second sets of interdigital heater electrodes such that the first set of interdigital heater electrodes is negatively biased relative to the laser diode cathode and relative to the second set of interdigital heater electrodes such that the P+-type current confinement layer transports electrical current between adjacent electrode digits of the first and second sets of interdigital heater electrodes along the direction of optical propagation defined by the active waveguide layer.

20. A laser source comprising a laser diode, a wavelength conversion device, an optical feedback loop, and a controller, wherein:
the laser diode is configured as a semiconductor heterostructure comprising an anode, a cathode, and an active waveguide layer formed between P and N type semiconductor layers defining a P-N junction;
the laser diode comprises a wavelength selective section, a phase matching section, and a gain section, each defined within the semiconductor heterostructure;
the wavelength selective section comprises a P+ type current confinement layer formed over the P type semiconductor layer and first and second sets of interdigital heater electrodes formed over the current confinement layer;
individual electrode digits of the first and second sets of interdigital heater electrodes alternate in succession along a direction of optical propagation defined by the active waveguide layer;
the phase matching section comprises a P+ type current confinement layer formed over the P type semiconductor layer and additional sets of interdigital heater electrodes formed over the current confinement layer;
individual electrode digits of the additional sets of interdigital heater electrodes alternate in succession along a direction of optical propagation defined by the active waveguide layer;
the controller is connected to the cathode, the first and second sets of interdigital heater electrodes, and the additional sets of interdigital heater electrodes such that the interdigital heater electrodes are positively or negatively biased relative to the laser diode cathode such that the P+-type current confinement layer transports electrical current between adjacent electrode digits of the first and second sets of interdigital heater electrodes along the direction of optical propagation defined by the active waveguide layer;

the relative bias of the first set of interdigital heater electrodes relative to the laser diode cathode is less than the forward bias turn-on voltage of the P-N junction when the interdigital heater electrodes are positively biased relative to the laser diode cathode;

the relative bias of the first set of interdigital heater electrodes relative to the laser diode cathode has an absolute value less than the reverse break-down voltage of the P-N junction when the interdigital heater electrodes are negatively biased relative to the laser diode cathode;

the wavelength conversion device is coupled to an optical output of the laser diode; and the optical feedback loop is configured to control the relative bias based on a converted output of the wavelength conversion device.

21. A laser source as claimed in claim 1 wherein the relative bias $+V_{BIAS}$ of the first set of interdigital heater electrodes relative to the laser diode cathode is less than the forward bias turn-on voltage of the P-N junction.

22. A laser source as claimed in claim 19 wherein the relative bias $-V_{BIAS}$ of the first set of interdigital heater electrodes relative to the laser diode cathode has an absolute value less than the reverse break-down voltage of the P-N junction.

23. A laser source as claimed in claim 1, wherein the current confinement layer comprises an electrically resistive contact layer that generates heat when it transports electrical current between adjacent electrode digits of the first and second sets of interdigital electrodes to define a heater current path along the waveguide that is localized above the active waveguide layer.

24. A laser source as claimed in claim 23 wherein the interdigital configuration of the first and second sets of interdigital heater electrodes allows for convenient tailoring of heater resistance by choosing a gap distance between two opposing electrodes so that a desired heating power is achieved with an appropriate voltage without causing damage to the laser or loss of optical power.

* * * * *